United States Patent [19]
Parris

[11] Patent Number: 6,160,743
[45] Date of Patent: Dec. 12, 2000

[54] SELF-TIMED DATA AMPLIFIER AND METHOD FOR AN INTEGRATED CIRCUIT MEMORY DEVICE

[75] Inventor: Michael C. Parris, Colorado Springs, Colo.

[73] Assignee: Mosel Vitelic, Inc., Hsinchu, Taiwan

[21] Appl. No.: 09/531,580

[22] Filed: Mar. 21, 2000

[51] Int. Cl.$^7$ ...................................................... G11C 7/00
[52] U.S. Cl. ............................................ 365/190; 365/207
[58] Field of Search .................................. 365/190, 205, 365/207, 208, 203

[56] References Cited

U.S. PATENT DOCUMENTS

| | | | |
|---|---|---|---|
| 4,623,989 | 11/1986 | Blake | 365/190 |
| 4,791,613 | 12/1988 | Hardee | 365/190 |
| 5,986,955 | 11/1999 | Siek et al. | 365/190 |
| 6,005,816 | 12/1999 | Manning et al. | 365/208 |

*Primary Examiner*—Trong Phan
*Attorney, Agent, or Firm*—William J. Kubida; Hogan & Hartson LLP

[57] ABSTRACT

A self-timed data amplifier and method for an integrated circuit memory device which overcomes the power consumption problems of conventional static data amplifiers while providing a high speed amplification function within design margins. By self-timing the un-equilibration of the data lines ("DQ" and its complement "DQB"), powering the main data amplifier and latching its output all with the same clock that controls the column address for the device, a high speed, low power, low risk approach is achieved. In a particular embodiment of the present invention, this may be effectuated by the integration of an amplifying, latching and equilibration function wherein all of the related circuitry is controlled by the memory device Y-clock signal (YCLKB) and the write signal (WRITEB) signal. In operation, the YCLKB signal goes "low" when a column address is determined to be valid, which then allows the DQ and DQB lines to be driven. The WRITEB signal goes "low" when a write command is asserted to the memory device keeping the differential amplifiers "off" in order to conserve power.

14 Claims, 2 Drawing Sheets

6,160,743

SELF-TIMED DATA AMPLIFIER AND METHOD FOR AN INTEGRATED CIRCUIT MEMORY DEVICE

BACKGROUND OF THE INVENTION

The present invention relates, in general, to the field of integrated circuit ("IC") memory devices. More particularly, the present invention relates to a self-timed data amplifier and method of especial utility with respect to dynamic random access memory ("DRAM") memory devices.

DRAM memory devices incorporate one or more arrays of memory cells, each consisting of a single transistor and associated capacitor. The transistor has one terminal coupled to an associated bit line and its gate coupled to a word line. Another terminal is generally coupled to circuit ground through the capacitor and by enabling the transistor via the word line, the charge on the capacitor may be placed on the associated bit line. Due to the dynamic nature of the charge stored in the capacitor, it must be periodically refreshed to replenish the leaked charge.

The changes in the bit line potential due to the charge in the capacitor are first amplified by a sense amplifier to be read as either a logic level "one" or "zero" depending on the charge which has been transferred to the bit lines. Generally the sense amplifiers compare the data from the memory cells with a reference level which is stored in corresponding reference cells. At this point, the data which has been read out is then re-written to the memory cells during a precharge operation and the data is passed by means of an internal input/output ("I/O") bus and a data amplifier to circuitry external to the memory device.

Currently, DRAM memory devices utilize static data amplifiers to drive the device data output. While generally sufficient for this purpose, they consume a relatively large amount of on-chip power resources. Moreover, conventional data amplifier technology incorporates clocked output paths which present some inherent risks in providing accurate data output if run at high speeds. Alternatively, if sufficient design margin is included in their operational speed, they can run too slowly and present an I/O bottleneck.

SUMMARY OF THE INVENTION

Disclosed herein is a self-timed data amplifier which overcomes the power consumption problems of static conventional data amplifiers while providing a high speed amplification function within design margins. By self-timing the un-equilibration of the data lines (generally denominated "DQ" and its complement "DQB"), powering the main data amplifier and latching its output all with the same clock that controls the column address, a high speed, low power, low risk approach is achieved.

In a particular embodiment of the present invention disclosed herein, this may be effectuated by the integration of an amplifying, latching and equilibration function wherein all of the related circuitry is controlled by the memory device Y-clock signal (YCLKB) and the write signal (WRITEB) signal. In operation, the YCLKB signal goes "low" when a column address is determined to be valid, which then allows the DQ and DQB lines to be driven. The WRITEB signal goes "low" when a write command is asserted to the memory device keeping the differential amplifiers "off" in order to conserve power.

Particularly disclosed herein is a data amplifier for an integrated circuit memory device incorporating column address valid and write command signals and having first and second complementary data input lines thereof. The amplifier comprises an equilibration circuit coupled to the data input lines and responsive to the column address valid signal for producing first and second complementary equilibrated data signal outputs. First and second differential amplifiers are respectively coupled to receive the complementary equilibrated data signal outputs and are responsive to the column address valid signal and the write command signal for producing an amplifier output signal. A latch is coupled to receive the amplifier output signal and is responsive to said column address valid signal and the write command signal for providing a data output signal.

Also disclosed herein is a method for amplifying data signals on first and second complementary data input lines in an integrated circuit memory device. The method comprises the steps of providing column address valid and write command signals, equilibrating the first and second complementary data input lines in response to the column address valid signal, differentially amplifying the data signals by means of first and second differential amplifiers in response to the column address valid signal to provide an amplified output signal, latching the amplified output signal to provide a data output signal and selectively decoupling the first and second differential amplifiers from a supply voltage line in response to the write command signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
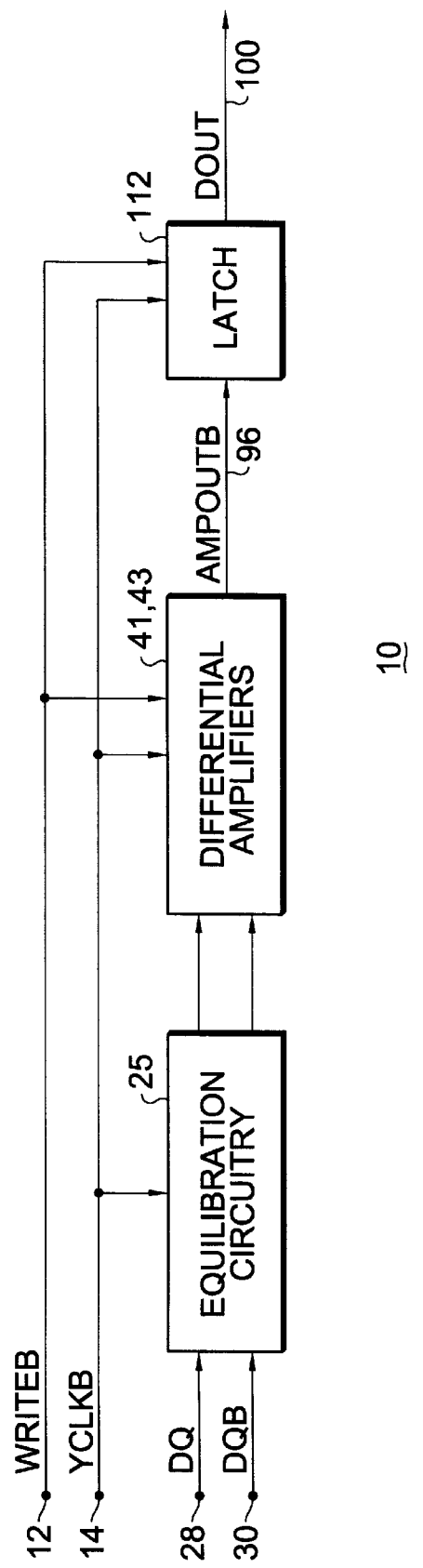
FIG. 1 is a simplified block diagram of a self-timed data amplifier in accordance with the present invention.

With reference now to FIG. 1, a self-timed data amplifier 10 in accordance with the present invention is shown. The amplifier 10 includes equilibration circuitry 25 coupled to receive the complementary DQ and DQB (DQ Bar) data signals on lines 28 and 30 respectively. The complementary outputs from the equilibration circuitry 25 is then provided to respective differential amplifiers 41, 43 as will be more fully described hereinafter. An AMPOUTB (Amplifier Output Bar) signal on line 96 is output from the differential amplifiers 41, 43 for input to a latch 112 which ultimately supplies a data output ("DOUT") signal on line 100.

As illustrated the memory device Y-clock provides a clocking signal YCLKB (Y-clock Bar) on line 14 which is provided to the equilibration circuitry 25, the differential amplifiers 41, 43 and the latch 112. Further, the memory device also provides a write signal WRITEB (Write Bar) on line 12 for input to the differential amplifiers 41, 43 and the latch 112.

In accordance with the present invention, the relatively small signal data lines (DQ line 28 and DQB line 30) are amplified, latched and equilibrated utilizing the same on-chip Y-clock signal that controls the memory device column decoders. Consequently, maximum speed with minimal power dissipation may be achieved in the data path of a dynamic random access memory device. Fundamentally, this is effectuated by the integrated amplifying, latching and equilibration technique disclosed wherein all of the related circuitry (equilibration circuitry 25, differential amplifiers 41, 43 and latch 112) is controlled by the YCLKB signal on line 14 and the WRITEB signal on line 12. In operation, the YCLKB signal on line 14 goes "low" when a column address is determined to be valid, which then allows the DQ and DQB lines 28, 30 to be driven. The WRITEB signal on line 12 goes "low" when a write command is asserted to the memory device keeping the differential amplifiers 41, 43 "off" in order to conserve power.

Figure 2:
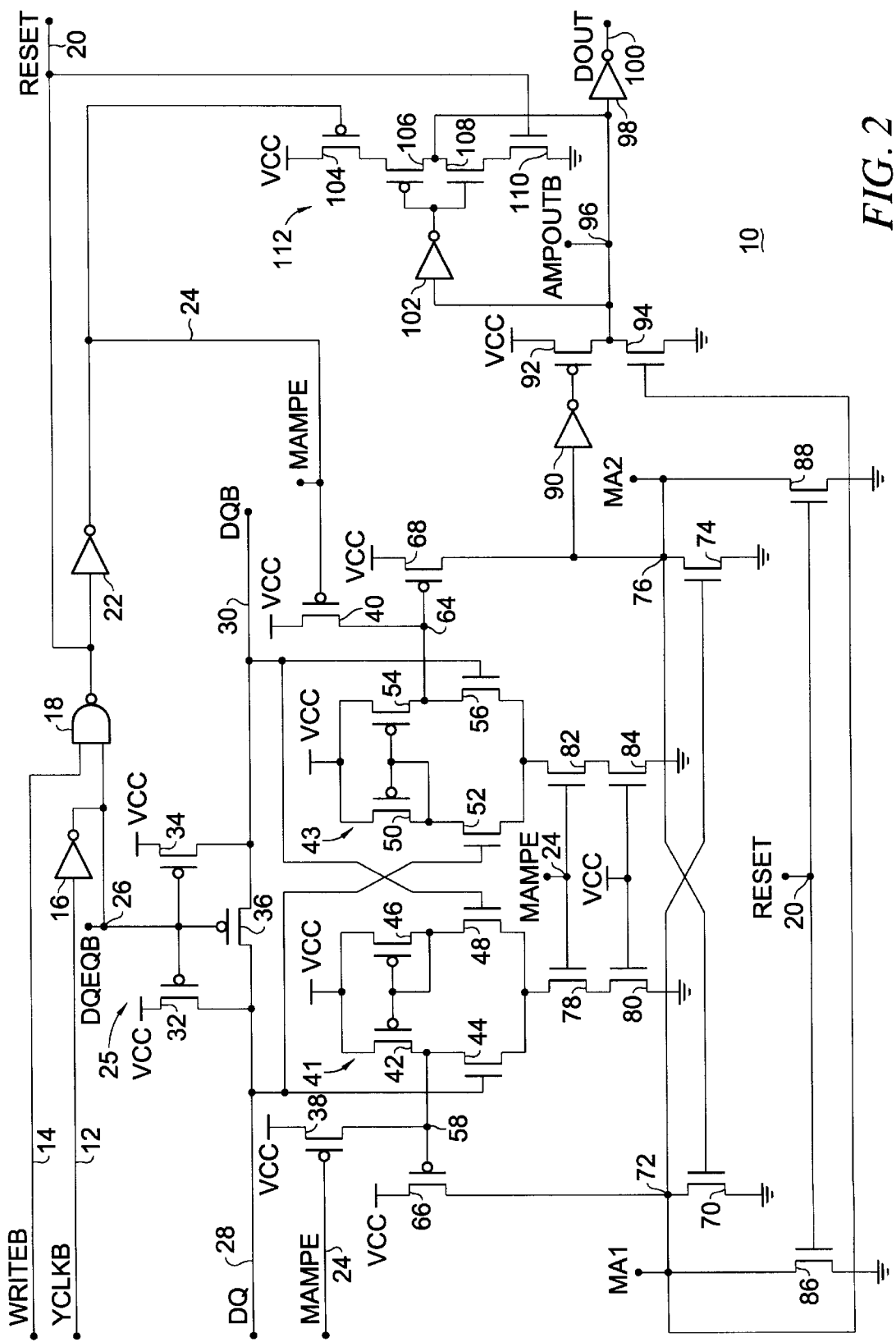
FIG. 2 is a detailed schematic diagram of a particular implementation of a self-timed data amplifier in accordance with the present invention.

With reference additionally now to FIG. 2, a detailed schematic illustration of a particular implementation of a self-timed data amplifier 10 in accordance with the present invention is shown. Corresponding circuit portions to those previously illustrated and described with respect to the preceding figure are like numbered.

The amplifier 10 receives the YCLKB input signal on line 12 as an input to an inverter 16. The WRITEB signal in also input on line 14 to one input of a two input NAND gate 18 which has as its other input the output of the inverter 16. The output of the inverter 16 is also coupled to the gate terminals of P-channel transistors 32, 34 and 36 which are also coupled to receive a DQEQB (DQ Equilibration Bar) signal on line 26 to the equilibration circuitry 25. The output of NAND gate 18 provides a RESET signal on line 20 and is inverted by means of inverter 22 to provide a MAMPE (Main Amplifier Power Enable) signal on line 24.

Complementary DQ and DQB data signals are received on lines 28 and 30 respectively coupled to opposite terminals of P-channel transistor 36. P-channel transistors 32 and 34 couple VCC to lines 28 and 30 respectively. The MAMPE signal on line 24 is applied to the gate terminals of P-channel transistors 38 and 40 which couple VCC to the gate terminals of P-channel transistors 66 and 68 respectively, each denominated as nodes 58 and 64. The MAMPE signal on line 24 is operative to turn "on" a pair of differential amplifiers 41 and 43 as will be more fully described hereinafter.

Node 58 is intermediate series coupled P-channel transistor 42 and N-channel transistor 44. One terminal of P-channel transistor 42 is coupled to VCC while an opposite terminal of N-channel transistor 44 is coupled to circuit ground through series connected N-channel transistors 78 and 80. P-channel transistor 46 and N-channel transistor 48 are coupled in parallel with P-channel transistor 42 and N-channel transistor 44. The gate terminals of P-channel transistors 42 and 46 are coupled together as well as to the node intermediate P-channel transistor 46 and N-channel transistor 48. The gate terminal of N-channel transistor 44 is coupled to line 28 while the gate terminal of N-channel transistor 48 is coupled to line 30. P-channel transistor 66 is coupled in series with N-channel transistor 70 at node 72 which is coupled to circuit ground by means of N-channel transistor 70.

Similarly, node 64 is intermediate series coupled P-channel transistor 54 and N-channel transistor 56. One terminal of P-channel transistor 54 is coupled to VCC while an opposite terminal of N-channel transistor 56 is coupled to circuit ground through series connected N-channel transistors 82 and 84. P-channel transistor 50 and N-channel transistor 52 are coupled in parallel with P-channel transistor 54 and N-channel transistor 56. The gate terminals of P-channel transistors 50 and 54 are coupled together as well as to the node intermediate P-channel transistor 50 and N-channel transistor 52. The gate terminal of N-channel transistor 52 is coupled to line 28 while the gate terminal of N-channel transistor 56 is coupled to line 30. P-channel transistor 68 is coupled in series with N-channel transistor 74 at node 76 which is coupled to circuit ground by means of N-channel transistor 74.

The gate terminals of N-channel transistors 78 and 82 are coupled to line 24 while the gate terminals of N-channel transistors 80 and 84 are coupled to VCC. The gate terminal of N-channel transistor is coupled to node 76 which receives a MA2 signal while the gate terminal of N-channel transistor 74 is coupled to node 72 to receive a MA1 signal. The MA1 signal is also coupled to one terminal of N-channel transistor 86 which has its other terminal coupled to circuit ground. Likewise, N-channel transistor 88 has one terminal coupled to receive the MA2 signal at node 76 and its other terminal coupled to circuit ground. The gate terminals of N-channel transistors 86 and 88 are coupled to receive a RESET signal on line 20.

Node 76 is coupled to the input of inverter 90 which has its output coupled to the gate terminal of P-channel transistor 92. P-channel transistor 92 is coupled in series with N-channel transistor 94 between VCC and circuit ground. The gate terminal of N-channel transistor 94 is coupled to Node 72. The node 96 intermediate P-channel transistor 92 and N-channel transistor 84 furnishes the AMPOUTB signal which is supplied to the input terminal of inverter 102. The output of inverter 102 is applied to the common connected gate terminals of P-channel transistor 106 and N-channel transistor 108 which are coupled in series with P-channel transistor 104 and N-channel transistor 110 between VCC and circuit ground, together comprising the output latch 112. The gate terminal of P-channel transistor 104 is coupled to line 24 while the gate terminal of N-channel transistor 110 is coupled to line 20. Node 96 is also coupled to the node intermediate P-channel transistor 106 and N-channel transistor 108 as well as to the input of another inverter 98. The output of inverter 98 provides the data output signal DOUT signal on line 100.

In operation, the YCLKB signal on line 12 goes "low" if any read or write command occurs. This allows the DQ/DQB lines 28, 30 to be driven for a "write" function or for a signal to develop on them from a column sense amplifier for a "read" function. If a "read" operation occurs, the WRITEB signal on line 14 will remain "high". This, together with the YCLKB signal on line 12 going "low", causes a RESET signal on line 20 at the output of NAND gate 18 to go "low" and the inverted MAMPE signal on line 24 to go "high" so that the differential amplifiers 41, 43 are turned "on". The output latch 112 made up of inverter 102, P-channel transistors 104, 106 and N-channel transistors 108, 110 is effectively transparent at this time. This allows the small signal on the DQ line 28 to be amplified and sent all the way through to the OUT node 100 through driver inverter 98. With the output latch 112 turned "off", this can allow the data to be transferred with maximum speed and minimum power. After the YCLKB timer expires, the YCLKB signal on line 12 returns to a logic "high" state. This equilibrates the DQ line 28 and turns "off" the differential amplifiers 41, 43. The YCLKB signal on line 12 going "high" also high-z's the output of the differential amplifiers 41, 43 and latches the previous data which can then be used to pipeline on out as necessary.

While there have been described above the principles of the present invention in conjunction with specific circuitry and applications, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A data amplifier for an integrated circuit memory device incorporating column address valid and write command signals and having first and second complementary data input lines thereof, said amplifier comprising:

an equilibration circuit coupled to said first and second complementary data input lines and responsive to said column address valid signal for producing first and second complementary equilibrated data signal outputs;

first and second differential amplifiers coupled to respectively receive said first and second complementary equilibrated data signal outputs and responsive to said column address valid signal and said write command signal for producing an amplifier output signal; and a latch coupled to receive said amplifier output signal and responsive to said column address valid signal and said write command signal for providing a data output signal.

2. The data amplifier of claim 1 wherein said equilibration circuit comprises at least one switching device for selectively coupling said first and second complementary data lines in response to said column address valid signal.

3. The data amplifier of claim 2 wherein said equilibration circuit further comprises first and second additional switching devices for respectively coupling said first and second complementary data lines to a supply voltage line in response to said column address valid signal.

4. The data amplifier of claim 3 wherein said at least one switching device and said first and second additional switching devices comprise MOS transistors.

5. The data amplifier of claim 4 wherein said MOS transistors are P-channel transistors.

6. The data amplifier of claim 1 wherein said first and second differential amplifiers are responsive to a power enable signal for selectively coupling and uncoupling said first and second differential amplifiers to a supply voltage line.

7. The data amplifier of claim 6 wherein said power enable signal is derived from said column address valid and said write command signals.

8. The data amplifier of claim 7 wherein said power enable signal is a logical combination of said column address valid and said write command signals.

9. The data amplifier of claim 6 wherein said latch is additionally responsive to said power enable signal.

10. A method for amplifying data signals on first and second complementary data input lines in an integrated circuit memory device, said method comprising:

providing column address valid and write command signals;

equilibrating said first and second complementary data input lines in response to said column address valid signal;

differentially amplifying said data signals by means of first and second differential amplifiers in response to said column address valid signal to provide an amplified output signal;

latching said amplified output signal by means of a latch for providing a data output signal; and selectively decoupling said first and second differential amplifiers from a supply voltage line in response to said write command signal.

11. The method of claim 10 further comprising the step of:

selectively decoupling said latch from said supply voltage line in response to said write command signal.

12. The method of claim 10 wherein said step of equilibrating said first and second complementary data input lines comprises the step of:

selectively coupling said first and second complementary data input lines together in response to an equilibration signal.

13. The method of claim 12 wherein said step of equilibrating said first and second complementary data input lines further comprises the step of:

selectively coupling said first and second complementary data input lines to said supply voltage line in response to said equilibration signal.

14. The method of claim 12 wherein said equilibration signal is produced by the step of:

inverting said column address valid signal.

* * * * *